(12) United States Patent
Vashchenko et al.

(10) Patent No.: US 7,057,867 B1
(45) Date of Patent: Jun. 6, 2006

(54) ELECTROSTATIC DISCHARGE (ESD) PROTECTION CLAMP CIRCUITRY

(75) Inventors: Vladislav Vashchenko, Palo Alto, CA (US); Peter J. Hopper, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/851,516

(22) Filed: May 21, 2004

(51) Int. Cl.
*H02H 9/00* (2006.01)

(52) U.S. Cl. ....................................................... 361/56
(58) Field of Classification Search ................. 361/56, 361/93.1, 111, 91.1, 91.5, 91.6; 257/355
See application file for complete search history.

(56) References Cited

U.S. PATENT DOCUMENTS

| | | | | |
|---|---|---|---|---|
| 3,612,915 A | * | 10/1971 | Frye | 327/205 |
| 4,396,999 A | * | 8/1983 | Malaviya | 365/159 |
| 4,496,854 A | * | 1/1985 | Chi et al. | 326/5 |
| 5,239,440 A | | 8/1993 | Merrill | |
| 5,276,350 A | | 1/1994 | Merrill et al. | |
| 5,276,582 A | | 1/1994 | Merrill et al. | |
| 5,538,907 A | * | 7/1996 | Aronowitz et al. | 438/200 |
| 6,465,848 B1 | * | 10/2002 | Ker et al. | 257/355 |
| 6,560,081 B1 | * | 5/2003 | Vashchenko et al. | 361/56 |
| 6,670,792 B1 | * | 12/2003 | Renehan | 322/28 |
| 2002/0153533 A1 | * | 10/2002 | Okushima | 257/173 |

* cited by examiner

*Primary Examiner*—Ronald Leja
(74) *Attorney, Agent, or Firm*—Vedder Price Kaufman & Kammholz, P.C.

(57) ABSTRACT

Electrostatic discharge (ESD) protection clamp circuitry including current tunneling circuitry to provide control current for controlling current shunting circuitry for shunting ESD current from the protected signal terminal.

12 Claims, 2 Drawing Sheets

ELECTROSTATIC DISCHARGE (ESD) PROTECTION CLAMP CIRCUITRY

BACKGROUND OF THE INVENTION

1. Field of the Invention

The present invention relates to electrostatic discharge (ESD) protection circuitry, and in particular to ESD protection clamp circuitry for circuits operating at low power supply voltages.

2. Description of the Related Art

Electrostatic discharge (ESD) in semiconductor integrated circuits is a well known problem. The presence of a sudden and undesired voltage spike within or at the interface pin of an integrated circuit can cause physical destruction of one or more portions of the circuitry. This is particularly true for field effect transistors, such as metal oxide semiconductor (MOS) devices, where the thin gate oxide is easily destroyed by large voltage spikes. Similarly, the PN junctions of bipolar devices can also be degraded if not destroyed.

This problem becomes increasingly acute, particularly for circuits employing both complementary MOS and bipolar processes, as the power supply voltages and signal levels decrease, e.g., 3.3 volts, 2.5 volts, 1.8 volts, and so on. As these types of circuits have developed, it has become increasingly common to provide ESD protection through the use of active clamp circuitry, many types of which are well known in the art.

Referring to FIG. 1, one conventional form of ESD clamp circuitry 10a has the clamp circuitry coupled between the signal node, e.g., defined as the interconnection between an input/output pad P1 and further internal circuitry 12, and the circuit reference terminal, e.g., ground. A serially coupled diode D1 and resistor R1 serve as control circuitry for a bipolar transistor Q1 which serves as the ESD current shunting device. As the ESD voltage increases and becomes sufficiently large to cause breakdown within the diode D1, a control current Icon flows through the diode D1 and resistor R1. This produces a voltage V1 across the resistor R1 and a base current I1 for the transistor Q1. This causes the transistor Q1 to turn on and conduct current Iesd associated with the ESD pulse to the circuit reference node, or ground.

Referring to FIG. 2, a similar circuit 10b uses a capacitor C1 instead of a diode D1. The rapid rise of the ESD voltage causes a current to flow briefly through the capacitor C1. This, in turn, causes the voltage V1 to appear across the resistor and turn on the current shunting transistor, in this example an N-channel MOS transistor N1, thereby causing the ESD current Iesd to be shunted to the circuit reference node.

While these circuits 10a, 10b, and others similar to these (e.g., where the control devices in the form of diodes and capacitors may be mixed and matched with different types of current shunting devices in the form of bipolar transistors or MOS transistors) have performed reasonably well up to now, such circuits do not perform as well with the lower power supply voltages and signal levels which have become more prevalent. At reduced power supply voltages and signal levels, leakage currents become more of a problem as the leakage currents become proportionately higher with respect to the power supply voltages and signal levels, and such leakage currents become more likely to be amplified by the clamp, thereby causing false triggering.

SUMMARY OF THE INVENTION

In accordance with the presently claimed invention, electrostatic discharge (ESD) protection clamp circuitry includes current tunneling circuitry to provide control current for controlling current shunting circuitry for shunting ESD current from the protected signal terminal.

In accordance with one embodiment of the presently claimed invention, electrostatic discharge (ESD) protection clamp circuitry includes first and second terminals, current shunting circuitry and current tunneling circuitry. The first terminal is to convey desired and undesired signals. The current shunting circuitry is coupled between the first and second terminals, and responsive to a control current having first and second states, wherein during the first and second control current states the current shunting circuitry provides nonconductive and conductive current paths, respectively, between the first and second terminals. The current tunneling circuitry is coupled to the first terminal and the current shunting circuitry, and responsive to the desired and undesired signals by providing the control current in the first and second states, respectively, wherein during the first and second control current states the control current has substantially zero and nonzero magnitudes, respectively.

In accordance with another embodiment of the presently claimed invention, electrostatic discharge (ESD) protection clamp circuitry includes current tunneling means and current shunting means. The current tunneling means is for responding to desired and undesired signals by generating a control current in first and second states, respectively, wherein during the first and second control current states the control current has substantially zero and nonzero magnitudes, respectively. The current shunting means is for responding to the control current by shunting substantially zero current corresponding to the desired signal during the first control current state and by shunting a nonzero current corresponding to the undesired signal during the second control current state.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
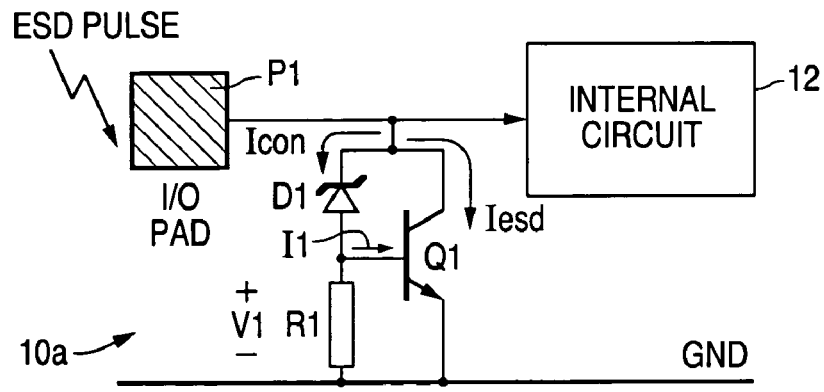
FIG. 1 is a schematic diagram of a conventional ESD clamp circuit.
Figure 2:
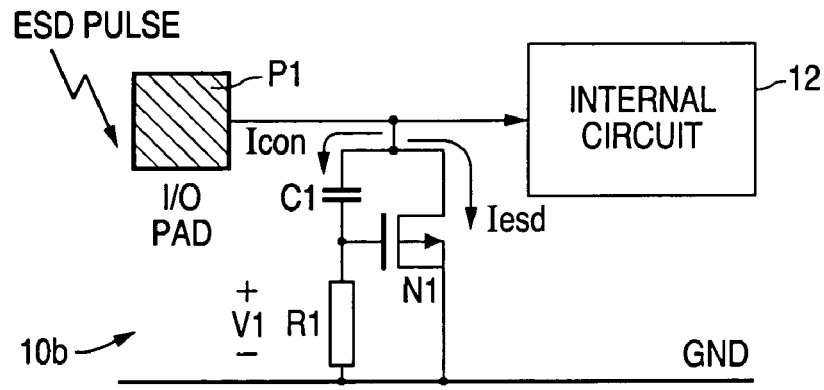
FIG. 2 is a schematic diagram of another conventional ESD clamp circuit.
Figure 3:
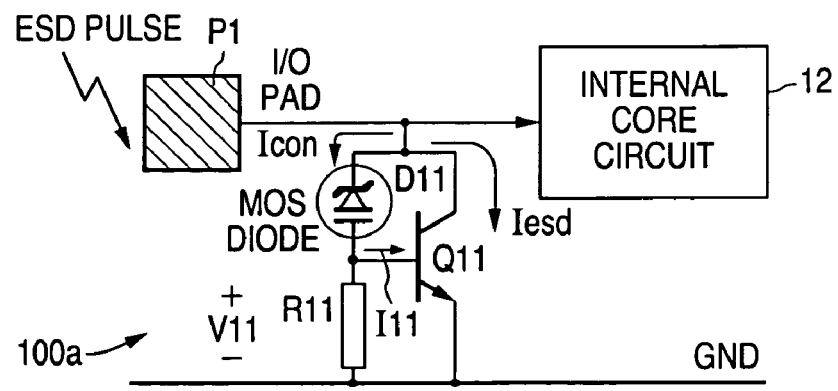
FIGS. 3–6 are schematic diagrams of ESD clamp circuits in accordance with various embodiments of the presently claimed invention.

Referring to FIG. 3, an ESD clamp circuit 100a in accordance with one embodiment of the presently claimed invention has a circuit topology which is similar to other ESD clamp circuits. However, rather than using a simple diode or capacitor (e.g., such as those used in the conventional circuits of FIGS. 1 and 2), a current tunneling device, such as a MOS diode D11, is used as the primary control element for the ESD current shunting device or circuit. For example, in this embodiment 100a, upon reception of an ESD pulse of sufficient magnitude, the diode D11 breaks down and a control current Icon flows, thereby producing a voltage V11 across the resistor R11 and the base current I11 for the bipolar transistor Q11 used to shunt the ESD current Iesd.

Using a current tunneling device such as this is advantageous as compared to the use of a diode or capacitor since such a current tunneling device with proper dielectric thickness will behave as a current source so long as the voltage across it exceeds the critical level needed for current tunneling. Such devices can be easily designed for sufficiently low breakdown voltages and low on currents, while at the same time having significantly less leakage currents than diodes which are not of the current tunneling type. Further, such tunneling devices typically have a high dynamic current range, thereby minimizing the risk of such device experiencing irreversible breakdown, particularly since most of the ESD current will be shunted by the current shunting transistor.

Figure 4:
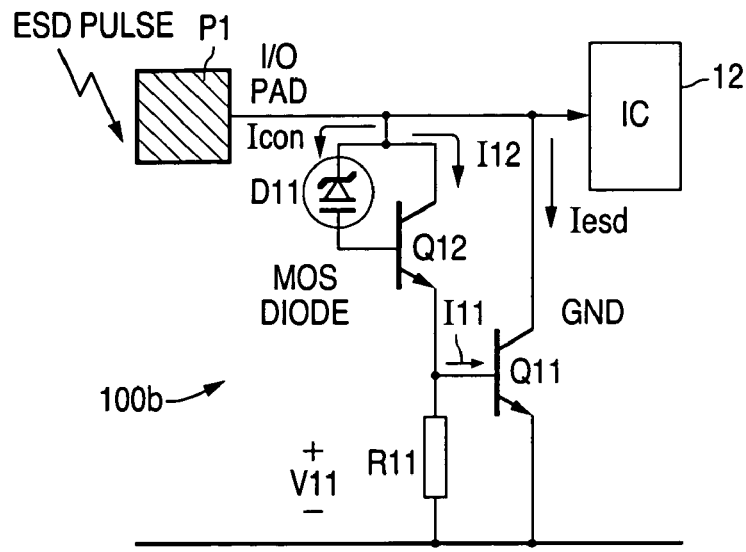

Referring to FIG. 4, an ESD protection circuit in accordance with another embodiment 100b of the presently claimed invention uses the current tunneling diode D11 to provide a control current Icon for use as a drive current for a driver transistor Q12 which, in turn, provides the driving current I11 and voltage V11 needed for triggering the ESD current shunting transistor Q11.

Figure 5:
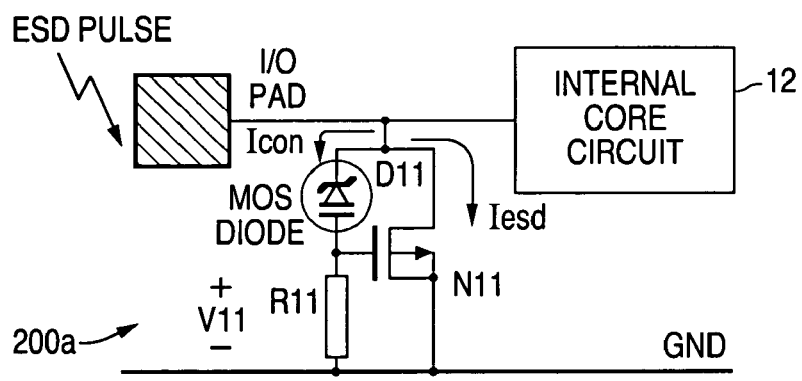

Referring to FIG. 5, an ESD protection circuit in accordance with another embodiment 200a of the presently claimed invention has a topology similar to the circuit of FIG. 3, with the exception that an N-channel MOS transistor N11 is used as the ESD current shunting device.

Figure 6:
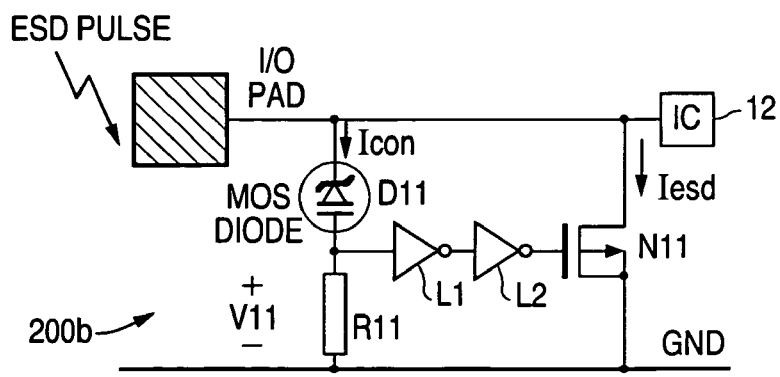

Referring to FIG. 6, an ESD protection circuit in accordance with another embodiment 200b of the presently claimed invention uses a current tunneling diode D11 and resistor R11 as in the circuits of FIGS. 3, 4 and 5. As before, once current tunneling occurs, the control current Icon produces a voltage V11 across the resistor R11. This voltage V11 drives a series of logic inverter circuits L1, L2 to produce a logic voltage at the gate terminal of the N-channel MOS transistor N11 used as the ESD current shunting device. It will be understood by one of ordinary skill in the art that the number of logic inverters can vary according to the amount of signal power amplification, delay or inversion is needed for driving the ESD current shunting device.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including electrostatic discharge (ESD) protection clamp circuitry, comprising:
   a first terminal to convey desired and undesired signals;
   a second terminal;
   current shunting circuitry coupled between said first and second terminals, and responsive to a received control current having first and second states, wherein during said first and second control current states said current shunting circuitry provides nonconductive and conductive current paths, respectively, between said first and second terminals; and
   current tunneling circuitry coupled to said first terminal and said current shunting circuitry, and responsive to said desired and undesired signals by operating in a current tunneling mode to provide to said current shunting circuitry said control current in said first and second states, respectively, wherein during said first and second control current states said control current has substantially zero and nonzero magnitudes, respectively.

2. The apparatus of claim 1, wherein said current shunting circuitry comprises one or more transistors with one or more respective control terminals coupled to said current tunneling circuitry.

3. The apparatus of claim 2, wherein:
   said one or more transistors comprises one or more bipolar junction transistors; and
   said one or more respective control terminals comprises one or more respective base terminals of said one or more bipolar junction transistors.

4. The apparatus of claim 2, wherein:
   said one or more transistors comprises first and second bipolar junction transistors mutually coupled in a Darlington configuration; and
   said one or more respective control terminals comprises a base terminal of said first bipolar junction transistor.

5. The apparatus of claim 2, wherein:
   said one or more transistors comprises one or more insulated gate field effect transistors (IGFETs); and
   said one or more respective control terminals comprises one or more respective gate terminals of said one or more IGFETs.

6. The apparatus of claim 5, wherein said one or more IGFETs comprises one or more metal-oxide-semiconductor field effect transistors (MOSFETs).

7. The apparatus of claim 1, wherein said current shunting circuitry comprises:
   one or more transistors with one or more respective control terminals; and
   one or more serially coupled voltage inversion circuits coupled between said current tunneling circuitry and said one or more transistor control terminals.

8. The apparatus of claim 1, wherein said current tunneling circuitry comprises a tunnel diode.

9. The apparatus of claim 1, wherein said current tunneling circuitry comprises a metal-oxide-semiconductor (MOS) diode.

10. The apparatus of claim 1, wherein said current tunneling circuitry comprises a diode-connected insulated gate field effect transistor (IGFET).

11. The apparatus of claim 1, wherein said current tunneling circuitry comprises a diode-connected metal-oxide-semiconductor field effect transistor.

12. An apparatus including electrostatic discharge (ESD) protection clamp circuitry, comprising:
 current tunneling means for responding to desired and undesired signals by operating in a current tunneling mode to generate a control current in first and second states, respectively, wherein during said first and second control current states said control current has substantially zero and nonzero magnitudes, respectively; and
 current shunting means for receiving and responding to said control current from said current tunneling means by shunting substantially zero current corresponding to said desired signal during said first control current state and by shunting a nonzero current corresponding to said undesired signal during said second control current state.

* * * * *

UNITED STATES PATENT AND TRADEMARK OFFICE
CERTIFICATE OF CORRECTION

PATENT NO. : 7,057,867 B1  Page 1 of 1
APPLICATION NO. : 10/851516
DATED : June 6, 2006
INVENTOR(S) : Vashchenko et al.

It is certified that error appears in the above-identified patent and that said Letters Patent is hereby corrected as shown below:

Column 1, line 50, delete "VI" and insert --V1--.

Column 5, line 3, after "transistor" and before ".", insert --(MOSFET)--.

Signed and Sealed this

Fifth Day of September, 2006

JON W. DUDAS
*Director of the United States Patent and Trademark Office*